US009007283B2

(12) United States Patent
Choi

(10) Patent No.: US 9,007,283 B2
(45) Date of Patent: *Apr. 14, 2015

(54) PIXEL AND ORGANIC LIGHT EMITTING DISPLAY DEVICE USING THE SAME

(75) Inventor: Deok-Young Choi, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 392 days.

This patent is subject to a terminal disclaimer.

(21) Appl. No.: 13/011,743

(22) Filed: Jan. 21, 2011

(65) Prior Publication Data

US 2012/0019501 A1    Jan. 26, 2012

(30) Foreign Application Priority Data

Jul. 20, 2010 (KR) .......................... 10-2010-0069936

(51) Int. Cl.
*G09G 3/32* (2006.01)
*G11C 19/28* (2006.01)
*H01L 27/32* (2006.01)

(52) U.S. Cl.
CPC .......... *G09G 3/3233* (2013.01); *H01L 27/3265* (2013.01); *G09G 3/3208* (2013.01); *G09G 2300/0819* (2013.01); *G09G 2300/0852* (2013.01); *G09G 2300/0861* (2013.01); *G09G 2310/0262* (2013.01)

(58) Field of Classification Search
CPC .............. G09G 3/3233; G09G 2300/0417; G09G 2300/043; G09G 2300/0809; G09G 2320/043; G09G 3/3208; G09G 2300/0852; H01L 27/3265

USPC ................... 257/57, 59, E51.018; 315/169.3; 365/177; 345/76, 77, 81, 82, 92, 204; 327/91

See application file for complete search history.

(56) References Cited

U.S. PATENT DOCUMENTS

| | | | |
|---|---|---|---|
| 7,528,808 B2 * | 5/2009 | Tam ................................. | 345/76 |
| 7,724,218 B2 * | 5/2010 | Kim et al. ....................... | 345/76 |
| 7,864,140 B2 * | 1/2011 | Kim et al. ....................... | 345/77 |
| 7,889,160 B2 * | 2/2011 | Yoo ................................. | 345/83 |
| 7,944,415 B2 * | 5/2011 | Jang et al. ....................... | 345/77 |
| 8,817,008 B2 * | 8/2014 | Park et al. ...................... | 345/212 |
| 2002/0047120 A1 * | 4/2002 | Inukai ............................. | 257/59 |
| 2003/0090447 A1 * | 5/2003 | Kimura .......................... | 345/82 |
| 2003/0111966 A1 * | 6/2003 | Mikami et al. ............. | 315/169.3 |
| 2003/0156084 A1 * | 8/2003 | Tsuchiya et al. ................ | 345/84 |
| 2003/0168992 A1 * | 9/2003 | Noguchi et al. ........... | 315/169.3 |
| 2004/0207615 A1 * | 10/2004 | Yumoto ........................ | 345/211 |
| 2004/0227707 A1 * | 11/2004 | Inukai ............................. | 345/76 |
| 2005/0140605 A1 * | 6/2005 | Jung ................................ | 345/76 |
| 2005/0151705 A1 * | 7/2005 | Fish ................................ | 345/76 |
| 2005/0168491 A1 * | 8/2005 | Takahara et al. ............... | 345/690 |
| 2005/0190177 A1 * | 9/2005 | Yumoto ........................ | 345/211 |
| 2005/0200300 A1 * | 9/2005 | Yumoto ..................... | 315/169.1 |
| 2005/0200618 A1 * | 9/2005 | Kim et al. ...................... | 345/204 |

(Continued)

FOREIGN PATENT DOCUMENTS

| | | | | |
|---|---|---|---|---|
| KR | 10-0562664 B1 | 3/2006 | | |
| KR | 10-2008-0022696 | * | 3/2008 | ............... G09G 3/30 |

(Continued)

*Primary Examiner* — Michael J Eurice

(74) *Attorney, Agent, or Firm* — Knobbe Martens Olson & Bear LLP

(57) ABSTRACT

A pixel and display having the pixel are disclosed. The pixel includes transistors along a leakage path from a storage capacitor. The pixel also includes transistors to apply a reference voltage to the leakage path to minimize leakage.

10 Claims, 2 Drawing Sheets

(56) References Cited

U.S. PATENT DOCUMENTS

| | | | |
|---|---|---|---|
| 2005/0237281 A1* | 10/2005 | Tam | 345/76 |
| 2005/0269961 A1* | 12/2005 | Shibusawa et al. | 315/169.3 |
| 2006/0170111 A1* | 8/2006 | Isa et al. | 257/775 |
| 2007/0001958 A1* | 1/2007 | Lee et al. | 345/92 |
| 2007/0007535 A1* | 1/2007 | Tang et al. | 257/72 |
| 2007/0085847 A1* | 4/2007 | Shishido | 345/204 |
| 2008/0001857 A1* | 1/2008 | Yoo | 345/76 |
| 2008/0238327 A1* | 10/2008 | Cho et al. | 315/169.3 |
| 2009/0201231 A1* | 8/2009 | Takahara et al. | 345/76 |
| 2009/0267935 A1* | 10/2009 | Kwon | 345/213 |
| 2010/0079419 A1* | 4/2010 | Shibusawa | 345/204 |

FOREIGN PATENT DOCUMENTS

| | | |
|---|---|---|
| KR | 10-2008-0022696 (A) | 3/2008 |
| KR | 10-2009-0003894 A | 1/2009 |
| KR | 10-1040786 (B1) | 6/2011 |

* cited by examiner

PIXEL AND ORGANIC LIGHT EMITTING DISPLAY DEVICE USING THE SAME

CROSS-REFERENCE TO RELATED APPLICATIONS

This application claims priority to and the benefit of Korean Patent Application No. 10-2010-0069936, filed on Jul. 20, 2010, in the Korean Intellectual Property Office, the entire content of which is incorporated herein by reference.

BACKGROUND

1. Field

An embodiment relates to a pixel and an organic light emitting display device using the same, and more particularly, to a pixel that can display an image having desired luminance and an organic light emitting display device using the same.

2. Description of the Related Technology

Recently, a variety of flat panel displays having reduced faults, weight, and volume as compared to cathode ray tubes, have been developed. Flat panel displays include liquid crystal displays, field emission displays, plasma display panels, and organic light emitting display devices, etc.

An organic light emitting display device displays an image, using organic light emitting diodes that emit light generated by recombination of electrodes and holes, has high response speed, and low power consumption.

An organic light emitting display device includes a plurality of pixels that are arranged in a matrix near intersections of a plurality of data lines, scanning lines, and power supply lines. The pixels generally include an organic light emitting diode, a driving transistor for controlling the amount of current that flows in the organic light emitting diode, a storage capacitor for storing a voltage in response to a data signal, and a compensation circuit for compensating for a threshold voltage of the driving transistor.

The pixels store a voltage in response to the data signal and the threshold voltage of the driving transistor in the storage capacitor, and apply current based on the stored voltage to the organic light emitting diode, so that the pixels display an image.

With this configuration, the voltage stored in the storage capacitor should be maintained in order to display an image of the desired brightness. Therefore, at least four transistors are connected in series at a leakage current path thereby preventing the change of the voltage in the storage capacitor.

For example, a first transistor may be formed at a first leakage path that is connected to the storage capacitor, and a second transistor may be formed at a second leakage path. The first transistor and the second transistor are formed by forming at least four transistors in series. However, there is a disadvantage that even though at least four transistors are connected along the leakage path as mentioned above, more than an acceptable level of leakage current is generated, so that the image of the desired luminance may be not displayed. In addition, the storage capacitor is formed to have a large capacitance to compensate for the leakage current in the traditional way, so that there is a disadvantage that aperture ratio of the display is decreased.

SUMMARY OF CERTAIN INVENTIVE ASPECTS

One inventive aspect is a pixel. The pixel includes an organic light emitting diode of which a cathode electrode is connected to a second power supply, a first transistor for controlling the amount of current that flows to the second power supply through the organic light emitting diode from a first power supply, and a second transistor connected between a data line and a second node, and turned on by a scanning signal supplied to an i-th scanning line, where i is a natural number. The pixel also includes a first capacitor connected between a first node and the second node, where the first node is connected to a gate electrode of the first transistor, a second capacitor connected between the first power supply and the first node, and a plurality of third transistors connected between the first node and the second electrode of the first transistor, where the third transistors are turned on by the scanning signal supplied to the i-th scanning line. The pixel also includes a plurality of fourth transistors connected between an initial power supply and the first node, and turned on by a scanning signal supplied to the i-1-th scanning line, and a leakage current prevention unit for supplying a fixed voltage to a fourth node between the fourth transistors and to a third node between the third transistors.

Another inventive aspect is an organic light emitting display device. The display device includes a scanning driver for supplying a scanning signal to scanning lines and for supplying an emission control signal to emission control lines, a data driver for supplying a data signal to data lines, a plurality of pixels located near intersections of the scanning lines and the data lines. Where i is a natural number, a pixel that is located on the i-th horizontal line includes an organic light emitting diode of which a cathode electrode is connected to a second power supply, a first transistor for controlling the amount of current that flows to the second power supply through the organic light emitting diode from a first power supply, and a second transistor connected between a data line and a second node, and turned on by a scanning signal supplied to an i-th scanning line, where i is a natural number. The pixel also includes a first capacitor connected between a first node and the second node, where the first node is connected to a gate electrode of the first transistor, a second capacitor connected between the first power supply and the first node, and a plurality of third transistors connected between the first node and the second electrode of the first transistor, where the third transistors are turned on by the scanning signal supplied to the i-th scanning line. The pixel also includes a plurality of fourth transistors connected between an initial power supply and the first node, and turned on by a scanning signal supplied to the i-1-th scanning line, and a leakage current prevention unit for supplying a fixed voltage to a fourth node between the fourth transistors and to a third node between the third transistors.

BRIEF DESCRIPTION OF THE DRAWINGS

The accompanying drawings, together with the specification illustrate exemplary embodiments, and, together with the description, serve to explain various principles and aspects.

DETAILED DESCRIPTION OF CERTAIN INVENTIVE EMBODIMENTS

Figure 1:
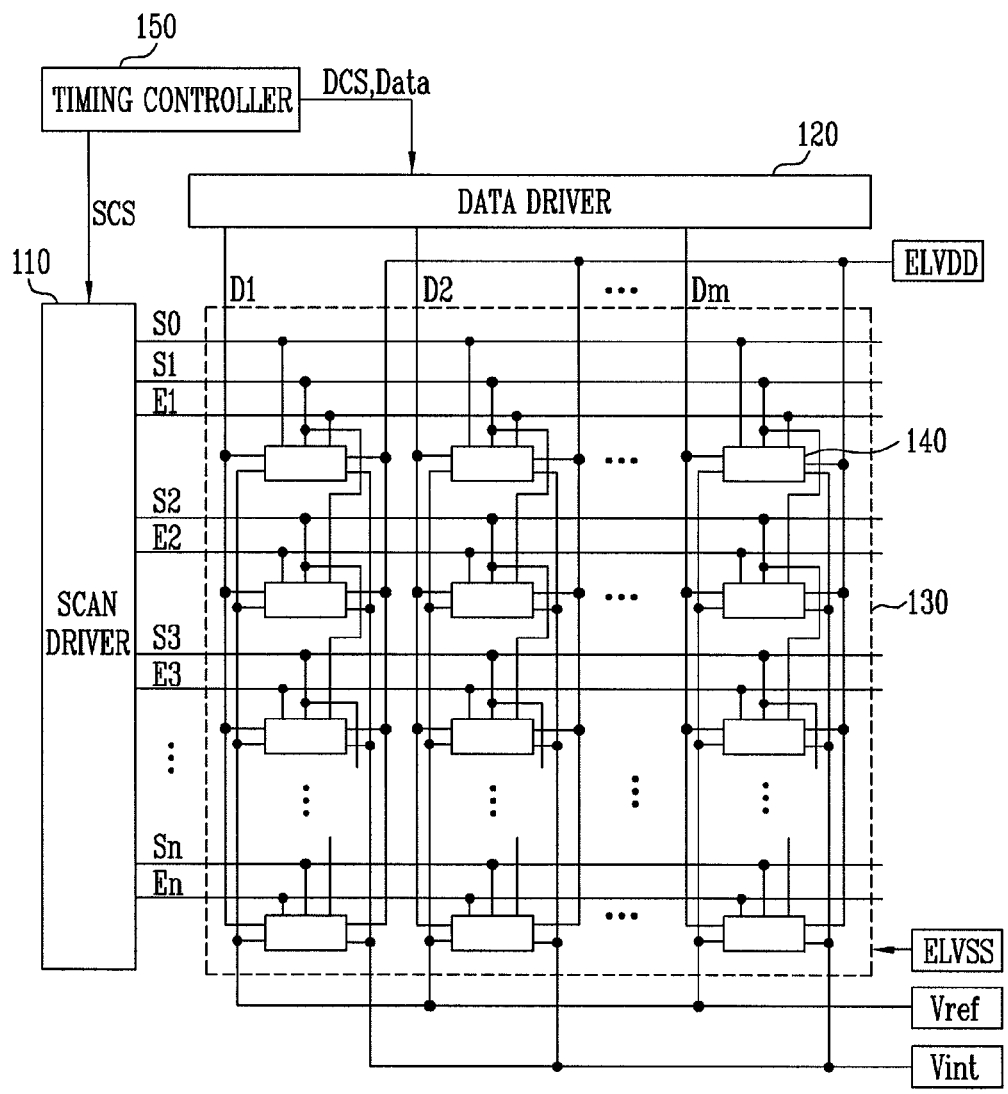
FIG. 1 shows an organic light emitting display device according to an embodiment.

Hereinafter, certain exemplary embodiments are described with reference to the accompanying drawings. Here, when a first element is described as being coupled to a second element, the first element may be directly coupled to the second element or may be indirectly coupled to the second element through a third element. Further, some of the elements that are not essential to the complete understanding of the invention are omitted for clarity. Also, like reference numerals generally refer to like elements throughout.

Hereinafter, various embodiments are described with reference to FIGS. 1 to 3.

FIG. 1 shows an organic light emitting display device according to an embodiment.

Referring to FIG. 1, the organic light emitting display device according some embodiments includes pixels 140 that are arranged to be connected to scanning lines S0 to Sn, emission control lines E1 to En, and data lines D1 to Dm. The display device also includes a scanning driver 110 for driving the scanning lines S0 to Sn and the emission control lines E1 to En, a data driver 120 for driving the data lines D1 to Dm, and a timing controller 150 for controlling the scanning driver 110 and the data driver 120.

The scanning driver 110 is supplied with a scanning driving control signal (SCS) from the timing controller 150. The scanning driver 110 that is supplied with the scanning driving control signal (SCS) generates a scanning signal, and sequentially supplies the generated scanning signal to the scanning lines S0 to Sn. In addition, the scanning driver 110 supplied with the scanning driving control signal (SCS) generates the emission control signal, and then sequentially supplies the generated emission control signal to the emission control lines E1 to En. With this configuration, the emission control signal supplied to i-th(here, i is a natural number) emission control line E1 overlaps the scanning signal that is supplied to i-1-th scanning line Si-1 and i-th scanning line Si.

The data driver 120 is supplied with a data driving control signal (DCS) from the timing controller 150. The data driver 120 that is supplied with the data driving control signal (DCS) supplies a data signal to the data lines D1 to Dm when supplying the scanning signal.

The timing controller 150 generates the data driving control signal (DCS) and the scanning driving control signal (SCS) in response to a synchronization signal supplied from the outside. The data driving control signal (DCS) that is generated in the timing controller 150 is supplied to the data driver 120, and the scanning driving control signal (SCS) is supplied to the scanning driver 110. In addition, the timing controller 150 supplies the data supplied from the outside to the data driver 120.

A pixel unit 130 is supplied with a first power voltage (ELVDD), a second power voltage (ELVSS), a reference voltage (Vref) and an initial power voltage (Vint) and supplies the voltages to pixels 140. The pixels 140 control the amount of current that flows to the second power supply (ELVSS) through the organic light emitting diode from the first power supply (ELVDD) in response to the data signal. The pixels 140 allow a gate electrode of the driving transistor to be initialized using the initial power (Vint) and the leakage current to be minimized using the reference voltage supply (Verf).

To achieve this, the first power supply voltage (ELVDD) is higher than the second power supply voltage (ELVSS). In addition, the initial power voltage (Vint) is lower than the voltage that can make the driving transistor to be turned on, such as the data signal. In addition, the reference voltage (Vref) is a higher voltage than the initial power supply voltage (Vint) and than the second power supply voltage (ELVSS), and may be higher, for example, than the data signal.

Figure 2:
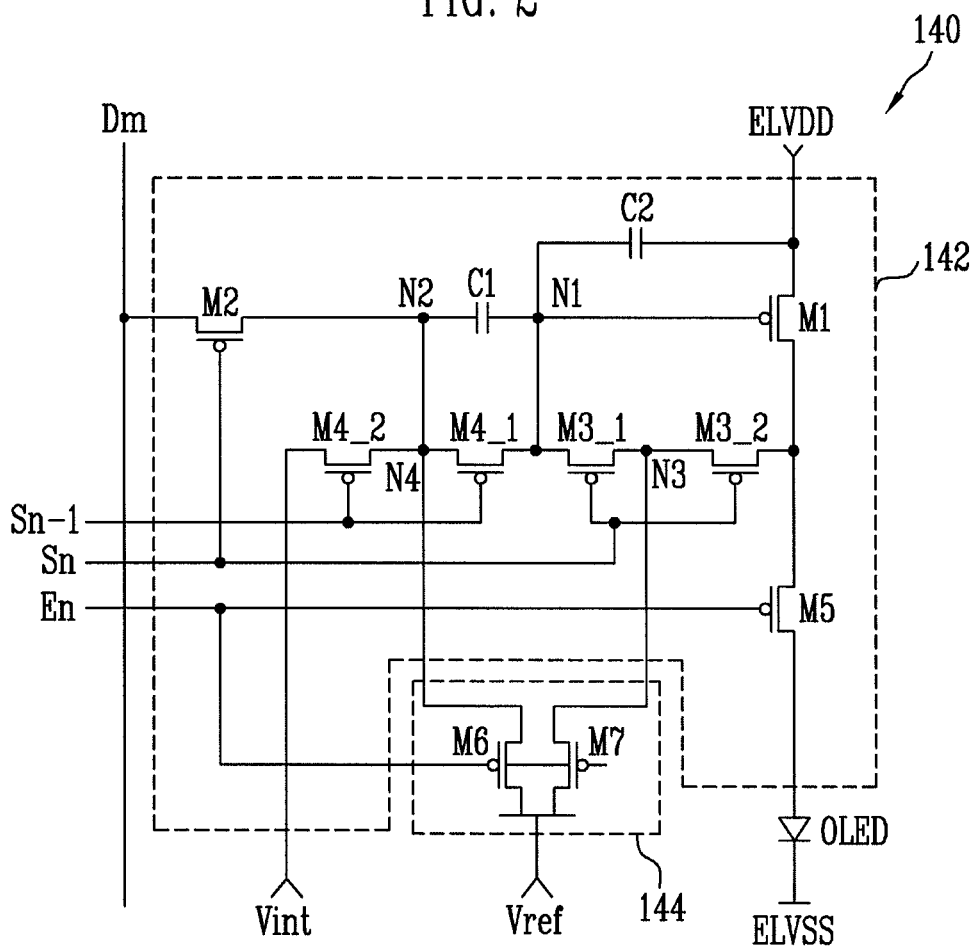
FIG. 2 shows an embodiment of pixels as depicted in FIG. 1.

FIG. 2 shows an embodiment of pixels of FIG. 1. For convenience, a pixel connected to n-1-th scanning line Sn-1, the n-th scanning line Sn and the m-th data line Dm is illustrated in FIG. 2.

Referring to FIG. 2, the pixels 140 include a pixel circuit 142 that is connected to the organic light emitting diode (OLED), the data line Dm, the scanning lines Sn-1 and Sn, and the emission control line En, and can control the amount of current that is supplied to the organic light emitting diode (OLED). The pixels 140 also include a leakage current prevention unit 144 that is electrically connected to the transistors formed along a leakage current path of the pixel circuit 142.

An anode electrode of the organic light emitting diode (OLED) is connected to the pixel circuit 142, and a cathode electrode is connected to the second power supply (ELVSS). The organic light emitting diode (OLED) generates light of luminance corresponding to the current that is supplied from the pixel circuit 142.

The pixel circuit 142 is charged with voltage in response to the data signal supplied from the data line Dm when the scanning signal is supplied to the scanning line Sn, and supplies the current to the organic light emitting diode (OLED) in response to the charged voltage. To achieve this, the pixel circuit 142 includes first to fifth transistors M1 to M5, a first capacitor C1, and a second capacitor C2.

A first electrode of the first transistor M1 is connected to the first power supply (ELVDD), and a second electrode is connected to an anode electrode of organic light emitting diode (OLED) through the fifth transistor M5. In addition, the gate electrode of the first transistor M1 is connected to a first node N1. The first transistor M1 supplies the current to the organic light emitting diode (OLED) in response to the voltage applied to the first node N1.

With this configuration, the first electrode is any one of a drain electrode and a source electrode, and the second electrode is set other electrode that is different from the first electrode. For example, when the first electrode is set as the source electrode, the second electrode is set as the drain electrode.

The third transistors M3_1, M3_2 are connected in series between the second electrode of the first transistor M1 and the first node N1. With this configuration, the third transistors M3_1, M3_2 are located along the leakage current path connected to the second power supply (ELVSS) through the organic light emitting diode (OLED) from the first node N1. The third transistors M3_1, M3_2 are turned on to diode connect the first transistor M1 when the scanning signal is supplied to the n-th scanning line Sn. Meanwhile, a common terminal (i.e., a third node N3) of the third transistors M3_1, M3_2 is connected to the leakage current prevention unit 144.

The first electrode of the second transistor M2 is connected to the data line Dm, and the second electrode is connected to the second node N2. In addition, the gate electrode of the second transistor M2 is connected to n-th scanning line Sn. The second transistor M2 is turned on to supply the data signal supplied to the data line D to the second node N2 when supplying the scanning signal to the n-th scanning line Sn.

Fourth transistors M4_1, M4_2 are connected in series between the first node N1 and the initial power supply (Vint). With this configuration, the fourth transistors M4_1, M4_2 are located along the leakage path connected to the initial power supply (Vint) from the first node N1. The fourth transistors M4_1, M4_2 are turned on when supplying the scanning signal to the n-1-th scanning lien Sn-1 to electrically connect the first node N1 to the initial power (Vint). Meanwhile, a common terminal (i.e., a fourth node N4) of the third transistors M4_1, M4_2 that are connected in series is connected to the second node N2 and the leakage current prevention unit 144.

The first electrode of a fifth transistor M5 is connected to the second electrode of the first transistor M1, and the second electrode is connected to the anode electrode of the organic light emitting diode (OLED). In addition, the gate electrode of the fifth transistor M5 is connected to the emission control line En. The fifth transistor M5 is turned on when the emission control signal is not supplied to electrically connect the organic light emitting diode (OLED) and the first transistor M1.

The first capacitor C1 is formed between the first node N1 and the second node N2. The first capacitor C1 is charged with a voltage in response to the data signal.

The second capacitor C2 is formed between the first node N1 and the first power supply (ELVDD). The second capacitor C2 is charged with voltage in response to the threshold voltage of the first transistor M1.

The leakage current prevention unit 144 minimizes the leakage current from the first and the second capacitors C1, C2. To achieve this, the leakage current prevention unit 144 includes a sixth transistor M6 and a seventh transistor M7.

The sixth transistor M6 is connected to the fourth node N4 and the reference voltage supply (Vref). In addition, the gate electrode of the sixth transistor M6 is connected to the emission control line En. The sixth transistor M6 is turned on to supply voltage of the reference voltage supply (Vref) to the second node N2 and the fourth node N4 when the emission control signal is not supplied. When voltage of the reference voltage supply (Vref) is supplied to the second node N1, voltage of the data signal supplied to the second node N2 during the previous period is changed to voltage of the reference voltage supply (Vref). When voltage of the reference voltage supply (Vref) is supplied to the fourth node N4, it can be prevented that the leakage current flows to the initial power supply (Vint) through the fourth transistors M4_1, M4_2 from the first node N1.

The seventh transistor M7 is connected between the third node N3 and the reference voltage supply (Vref). In addition, the gate electrode of the seventh transistor M7 is connected to the emission control line En. The seventh transistor M7 is turned on when the emission control signal is not supplied to supply voltage of the reference voltage supply (Vref) to the third node N3. When voltage of the reference voltage supply (Vref) is supplied to the third node N3, it can be prevented that the leakage current flows to the organic light emitting diode (OLED) through the third transistors M3_1, M3_2 from the first node N1.

Figure 3:
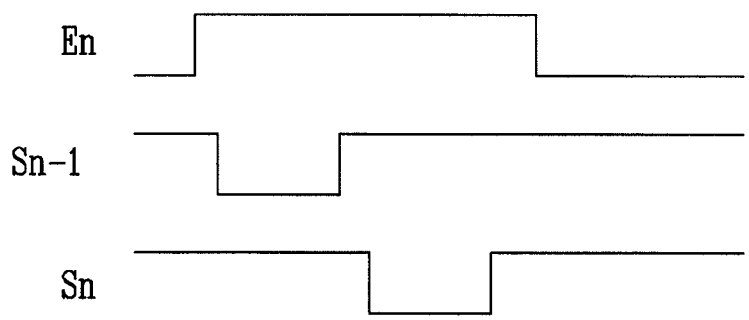
FIG. 3 shows a method for driving pixels as depicted in FIG. 2.

FIG. 3 shows a method for driving the pixel as depicted in FIG. 2.

Referring to FIG. 3, the emission control signal is supplied to the emission control line En. When the emission control signal is supplied to the emission control line En, the fifth transistor M5, the sixth transistor M6 and the seventh transistor M7 are turned off.

After turning off the fifth to the seventh transistors M5 to M7, the scanning signal is supplied to the n–1-th scanning line Sn–1. When the scanning signal is supplied to the n–1-th scanning line Sn–1, the fourth transistors M4_1, M4_2 are turned on. When the fourth transistors M4_1, M4_2 are turned on, the initial power (Vint) is supplied to the first node N1 and the second node N2, thereby initializing the first node N1 and the second node N2 with voltage of the initial power supply (Vint).

The scanning signal is then supplied to the n-th scanning line Sn. When the scanning signal is supplied to the n-th scanning line N1, the second transistor M2 and the third transistors M3_1, M3_2 are turned on. When the second transistor M2 is turned on, the data signal is supplied to the first capacitor C1 from the data line Dm.

When the third transistors M3_1, M3_2 are turned on, the first node N1 and the second electrode of the first transistor M1 are electrically connected so that the first transistor M1 is diode connected. With this configuration, since the first node is initialized by the voltage of the initial power supply (Vint), the first transistor M1 is turned on. When the first transistor M1 is turned on, the voltage that is the threshold voltage subtracted from the voltage of the data signal is supplied to the second capacitor C2. With this configuration, the second capacitor C2 is charged with a voltage in response to the threshold voltage of the first transistor M1, and the capacitor C1 is charged with voltage in response to the data signal.

Next, the emission control signal is not supplied to the emission control line En, and the fifth transistor M5 to the seventh transistor M7 are turned on.

When the sixth transistor M6 is turned on, voltage of the reference voltage supply (Vref) is supplied to the second node N2 and the fourth node N4. When the reference voltage (Vref) is supplied to the second node N2, the voltage of the second node N2 is increased to the voltage of the reference voltage (Vref) from voltage of the data signal. With this configuration, the voltage of the first node N1 is changed in response to the amount of the voltage change of the second node N2. The first transistor M1 supplies current in response to voltage applied to the first node N1 to the organic light emitting diode (OLED).

When the seventh transistor M7 is turned on, the voltage of the reference voltage (Vref) is supplied to the third node N3. When the voltage of the reference voltage (Vref) is supplied to the third node N3, the leakage current that flows to the organic light emitting diode (OLED) through the third transistors M3_1, M3_2 is minimized Because the voltage of the reference voltage supply (Vref) is higher than the voltage of the second power supply (ELVSS), the leakage current is minimized.

When the fifth transistor M5 is turned on, the second electrode of the first transistor M1 and the anode electrode of the organic light emitting diode (OLED) are connected. With this configuration, the first transistor M1 controls the amount of current that flows to the second power supply (ELVSS) through the organic light emitting diode (OLED) from the first power supply (ELVDD) in response to voltage applied to the first node N1.

As mentioned above, the leakage current that flows to the initial power supply (Vint) and the organic light emitting diode (OLED) from the first node N1 can be minimized by supplying the reference voltage (Vref) to the fourth node N4 and the third node N3 during emitting light from the organic light emitting diode (OLED), so that the image having the desired luminance can be displayed.

While various aspects have been described in connection with certain exemplary embodiments, it is to be understood that the invention is not limited to the disclosed embodiments, but, on the contrary, is intended to cover various modifications and equivalent arrangements.

What is claimed is:
1. A pixel comprising:
  an organic light emitting diode of which a cathode electrode is connected to a second power supply;
  a first transistor for controlling the amount of current that flows to the second power supply through the organic light emitting diode from a first power supply;

a second transistor connected between a data line and a second node, and turned on by a scanning signal supplied to an i-th scanning line, wherein i is a natural number;

a first capacitor connected between a first node and the second node, wherein the first node is connected to a gate electrode of the first transistor;

a second capacitor connected between the first power supply and the first node;

a plurality of third transistors connected between the first node and a second electrode of the first transistor, wherein the third transistors are turned on by the scanning signal supplied to the i-th scanning line;

a plurality of fourth transistors connected between an initial power supply and the first node, and turned on by a scanning signal supplied to the i-1-th scanning line to supply initial power to the gate electrode of the first transistor; and a leakage current prevention unit for supplying a fixed voltage to a fourth node between the fourth transistors and to a third node between the third transistors, wherein the leakage current prevention unit includes:

a sixth transistor connected between a reference voltage supply supplying the fixed voltage and the fourth node, and a seventh transistor connected between the reference voltage supply and the third node, and wherein the voltage of the reference voltage supply is higher than the voltage of the initial power supply.

2. The pixel as claimed in claim 1, wherein the reference voltage supply has a voltage higher than the voltage of the second power supply and higher than the data signal supplied to the data line.

3. The pixel as claimed in claim 1, wherein the sixth transistor and the seventh transistor are off while the third transistors and the fourth transistors are on.

4. The pixel as claimed in claim 1, wherein the fourth node and the second node are electrically connected.

5. The pixel as claimed in claim 1, further comprising a fifth transistor connected between the organic light emitting diode and the second electrode of the first transistor, and is on while the third transistors and the fourth transistors are off.

6. An organic light emitting display device, comprising:

a scanning driver for supplying a scanning signal to scanning lines and for supplying an emission control signal to emission control lines;

a data driver for supplying a data signal to data lines;

a plurality of pixels located near intersections of the scanning lines and the data lines;

wherein i is a natural number and a pixel that is located on the i-th horizontal line, includes:

an organic light emitting diode of which a cathode electrode is connected to a second power supply;

a first transistor for controlling the amount of current that flows to the second power supply through the organic light emitting diode from a first power supply;

a second transistor connected between a data line and a second node, and turned on by a scanning signal supplied to an i-th scanning line;

a first capacitor connected between a first node and the second node, wherein the first node is connected to a gate electrode of the first transistor;

a second capacitor connected between the first power supply and the first node;

a plurality of third transistors connected between the first node and a second electrode of the first transistor, wherein the third transistors are turned on by the scanning signal supplied to the i-th scanning line;

a plurality of fourth transistors connected between an initial power supply and the first node, and turned on by a scanning signal supplied to the i-1-th scanning line to supply initial power to the gate electrode of the first transistor; and a leakage current prevention unit for supplying a reference voltage to a fourth node between the fourth transistors and to a third node between the third transistors, wherein the leakage current prevention unit includes:

a sixth transistor between a reference voltage supply supplying the reference voltage and the fourth node, and is turned off by supplying the emission control signal to the i-th emission control line, and a seventh transistor between the reference voltage supply and the third node, and wherein the voltage of the reference voltage supply is higher than the voltage of the initial power supply.

7. The organic light emitting display device as claimed in claim 6, wherein the scanning driver supplies the emission control signal to an i-th emission control line while the scanning signal is supplied to the i-1-th scanning line and while the scanning signal is supplied to the i-th scanning line.

8. The organic light emitting display device as claimed in claim 6, wherein the reference voltage supply is a higher voltage than the data signal supplied to the data line.

9. The organic light emitting display device as claimed in claim 6, wherein the second node and the fourth node are electrically connected.

10. The organic light emitting display device as claimed in claim 6, further comprising:

a fifth transistor connected between the organic light emitting diode and the second electrode of the first transistor, and turned off by supplying the emission control signal to the i-th emission control line.

* * * * *